(12) United States Patent
Bran

(10) Patent No.: US 7,185,661 B2
(45) Date of Patent: Mar. 6, 2007

(54) RECIPROCATING MEGASONIC PROBE

(75) Inventor: Mario E. Bran, Garden Grove, CA (US)

(73) Assignee: Akrion Technologies, Inc., Wilmington, DE (US)

( * ) Notice: Subject to any disclaimer, the term of this patent is extended or adjusted under 35 U.S.C. 154(b) by 669 days.

(21) Appl. No.: 10/140,029

(22) Filed: May 6, 2002

(65) Prior Publication Data
US 2003/0205238 A1    Nov. 6, 2003

(51) Int. Cl.
*B08B 7/04* (2006.01)
(52) U.S. Cl. .............................. 134/1.3; 134/1; 134/33; 134/184; 134/902
(58) Field of Classification Search ................ 134/1, 134/1.3, 33, 34, 184, 902
See application file for complete search history.

(56) References Cited

U.S. PATENT DOCUMENTS

| | | | |
|---|---|---|---|
| 4,537,511 A | | 8/1985 | Frei |
| 4,902,350 A | | 2/1990 | Steck |
| 5,038,808 A | * | 8/1991 | Hammond et al. ......... 134/184 |
| 5,980,647 A | | 11/1999 | Buker et al. |
| 6,021,789 A | * | 2/2000 | Akatsu et al. ............ 134/57 R |
| 6,039,059 A | * | 3/2000 | Bran .......................... 134/105 |
| 6,140,744 A | | 10/2000 | Bran |
| 6,178,974 B1 | * | 1/2001 | Kobayashi et al. .......... 134/1.3 |
| 6,199,563 B1 | * | 3/2001 | Uehara et al. ............. 134/25.4 |
| 6,276,370 B1 | * | 8/2001 | Fisch et al. .................. 134/1.3 |
| 6,367,493 B2 | * | 4/2002 | Schuler et al. .............. 134/184 |
| 6,539,952 B2 | * | 4/2003 | Itzkowitz ..................... 134/1.3 |
| 6,684,890 B2 | * | 2/2004 | Nicolosi et al. ............. 134/148 |
| 6,843,257 B2 | * | 1/2005 | Yeo et al. .................... 134/1.3 |
| 2002/0029788 A1 | | 3/2002 | Verhaverbeke et al. |
| 2002/0185155 A1 | * | 12/2002 | Franklin ..................... 134/1.3 |

FOREIGN PATENT DOCUMENTS

| | | |
|---|---|---|
| JP | 62-173935 | 7/1967 |
| JP | 61-179159 | 7/1986 |

OTHER PUBLICATIONS

IBM Technical Disclosure Bulletin—vol. 37 No. 06A Jun. 1994.

* cited by examiner

*Primary Examiner*—Alexander Markoff
(74) *Attorney, Agent, or Firm*—Brian L. Belles; Wolf, Block, Schorr & Solis-Cohen

(57) ABSTRACT

A method of cleaning a substrate comprises placing the substrate on a rotating fixture, placing a liquid on at least one side of the substrate, and creating a standing wave of megasonic energy oriented generally parallel to the substrate. The standing wave generates an associated pattern of high-agitation regions in the liquid. The method further comprises moving the standing wave back-and-forth so as to move the pattern of high-agitation regions about with respect to the substrate. An apparatus for cleaning substrates comprises a support to rotate the substrate about a first axis, and a transmitter extending generally parallel to a surface of the substrate. The apparatus further comprises a megasonic transducer in acoustically coupled relation to the transmitter, and a reciprocation drive in fixed relation to the transmitter. The reciprocation drive moves the transmitter back-and-forth within a plane generally parallel to the surface of the substrate.

18 Claims, 10 Drawing Sheets

RECIPROCATING MEGASONIC PROBE

BACKGROUND OF THE INVENTION

1. Field of the Invention

The present invention relates to an apparatus and method for cleaning substrates, including semiconductor wafers or other such items requiring extremely high levels of cleanliness.

2. Description of the Related Art

Substrates such as semiconductor wafers are frequently cleaned in a cleaning solution into which megasonic energy is propagated. Megasonic cleaning systems, which operate at a frequency over twenty times higher than ultrasonic, safely and effectively remove particles from materials without the negative side effects associated with ultrasonic cleaning.

One type of megasonic cleaning apparatus shown in U.S. Pat. No. 6,140,744 comprises a piezoelectric transducer coupled to a transmitter in the form of a probe. The transducer is electrically excited such that it vibrates, and the probe transmits high frequency energy into liquid sprayed onto an adjacent, rotating semiconductor wafer. The agitation of the cleaning fluid produced by the megasonic energy loosens particles on the wafer. Contaminants are thus vibrated away from the surfaces of the wafer and removed through the continuous flow of the cleaning fluid.

In U.S. Pat. No. 4,537,511, issued to Frei, an elongated metal tube in a tank of cleaning fluid is energized in the longitudinal wave mode by a transducer that extends through a wall of the tank and is attached to the end of the tube. In order to compensate for relatively high internal losses, the radiating arrangement uses a relatively thin-walled tubular member.

A need exists for an improved apparatus and method which can be used to clean semiconductor wafers and other substrates.

SUMMARY OF THE INVENTION

In accordance with one embodiment of the invention, a method of cleaning a substrate comprises placing the substrate on a rotating fixture, applying a liquid to at least one side of the substrate, and creating a standing wave of megasonic energy oriented generally parallel to the substrate. The standing wave generates an associated pattern of high-agitation regions in the liquid. The method further comprises creating relative back-and-forth movement between the standing wave and the substrate so as to move the pattern of high-agitation regions with respect to the substrate.

In accordance with another embodiment of the invention, an apparatus for cleaning substrates comprises a rotary support which is adapted to support the substrate and rotate it about a first axis, and a megasonic energy transmitter extending generally parallel to a surface of the substrate. The apparatus further comprises a megasonic transducer in acoustically coupled relation to the transmitter, and a reciprocation drive in fixed relation to the transmitter. The reciprocation drive moves the transmitter back-and-forth within a plane generally parallel to the surface of the substrate. The megasonic transmitter agitates a liquid on a surface of the substrate, which results in a pattern of high-agitation regions formed in the liquid by the transmitter.

In still another embodiment a method of cleaning a substrate comprises placing the substrate on a rotating fixture, placing a liquid on at least one side of the substrate, and creating a standing wave of megasonic energy oriented generally parallel to the substrate. The standing wave generates an associated pattern of high-agitation regions in the liquid. The method further comprises causing back-and-forth movement of the standing wave relative to the substrate or vice versa so as to move the pattern of high-agitation regions about with respect to the substrate.

In still another embodiment a method of cleaning a substrate comprises placing the substrate on a rotating fixture, applying a liquid to at least one side of the substrate, and creating a wave of megasonic energy oriented generally parallel to the substrate, the wave generating high-agitation regions in the liquid. The method further comprises moving the high-agitation regions about with respect to the substrate.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

Having thus summarized the general nature of the invention and its essential features and advantages, certain preferred embodiments and modifications thereof will become apparent to those skilled in the art from the detailed description herein having reference to the figures that follow, of which.

DETAILED DESCRIPTION OF THE PREFERRED EMBODIMENT

Figure 1:
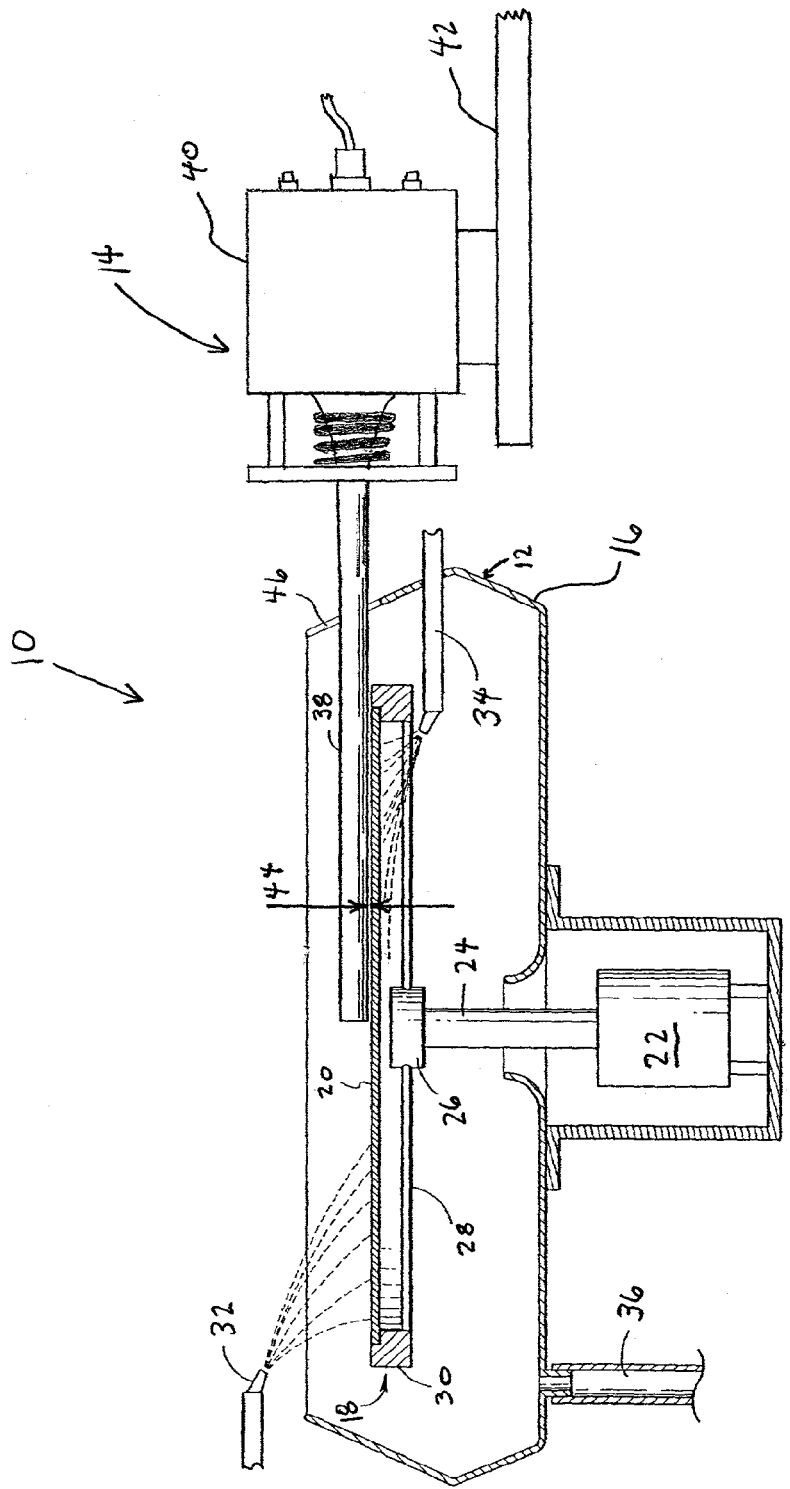
FIG. 1 is a schematic side elevation view of a known megasonic wafer cleaner.
Figure 2:
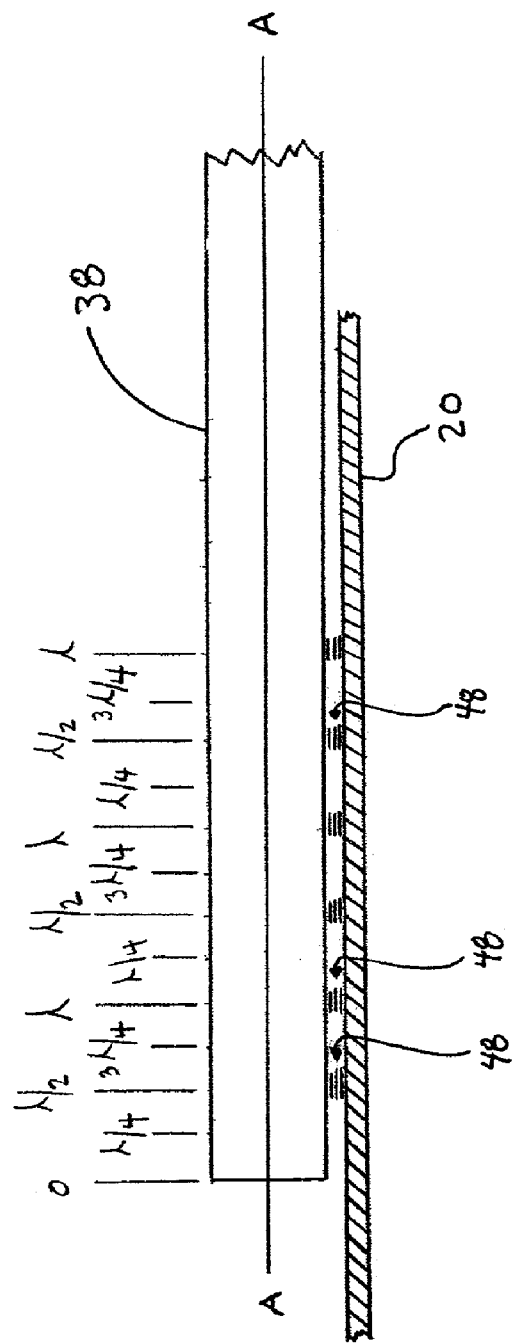
FIG. 2 is a schematic side elevation view of a transmitter-wafer junction of the prior-art cleaner of FIG. 1.

FIGS. 1–2 depict a known megasonic cleaning apparatus 10, generally comprising a tank-and-fixture assembly 12 and a transmitter assembly 14. The tank-and-fixture assembly 12 is made up of a tank 16 inside of which is disposed a fixture 18 supporting a substrate 20 (such as a semiconductor wafer, photomask, flat-panel display, magnetic heads, or any other similar item requiring a high level of cleanliness). The fixture 18 generally comprises a motor 22, shaft 24, hub 26, spokes 28, and an annular rim 30. The rim 30 supports the substrate 20 as it is rotated about a generally vertical axis by the motor 22, in cooperation with the shaft, hub, spokes, etc.

Upper and/or lower nozzles 32, 34 dispense a liquid, typically deionized water or other cleaning solution, onto the upper and/or lower surfaces of the substrate 20. A drain line 36 in the lower end of the tank 16 permits accumulated cleaning solution to exit therefrom.

In the form illustrated herein, the transmitter assembly 14 comprises an elongated element 38, which can be termed a probe, acoustically coupled to a megasonic transducer (not shown) inside of a housing 40. The housing 40 is mounted to a support 42 so that the shaft of the probe 38 extends generally parallel to the surface of the substrate 20 and is separated therefrom by a narrow gap 44. The support 42, along with the transmitter assembly 14, is movable upwardly or is retractable to allow insertion/removal of substrates to the fixture 18. A slot 46 may be included in the tank 16 to permit the probe 38 to be pivoted in and out of the tank; alternatively, any other suitable method or structure may be employed to facilitate movement of the probe 38 in and out of the tank where necessary.

In operation, high-frequency electrical power is supplied to the megasonic transducer, which vibrates at a high, megasonic frequency. This vibration is transmitted to the probe 38, which also vibrates at a megasonic frequency. The megasonic vibration of the probe 38 agitates the meniscus of liquid on the substrate near the probe, creating a cleaning action on the surface of the substrate. Where the lower nozzle 34 is employed to provide cleaning liquid on the lower surface of the substrate 20, this lower-surface liquid is also agitated in the areas nearest the probe. As the substrate rotates under the probe, substantially the entire surface of the substrate is exposed to the cleaning action generated by the probe and agitated liquid.

FIG. 2 depicts schematically the shaft of the probe 38 and an adjacent portion of the substrate 20, during operation of the cleaning apparatus. In the probe 38 there is developed a standing longitudinal wave of megasonic energy that acts generally along the longitudinal axis of the probe shaft, shown in FIG. 2 as the line A—A. This standing wave is characterized by antinodes (i.e., zones exhibiting alternating compression and expansion) occurring at 8/4 and 38/4 as indicated in FIG. 2. The nodes of the standing wave thus occur at 8/2 and 8. Due to the mechanics of longitudinal waves, a radial component of the standing longitudinal wave is generated, having a similar wavelength as the longitudinal wave and a series of nodes and antinodes that is phase-shifted by 90° (8/4) with respect to the longitudinal wave. Thus the radial-component antinodes occur at 8/2 and 8 as shown in FIG. 2, creating a pattern of high-agitation regions 48 corresponding to the radial antinodes.

Such megasonic cleaners have proven quite effective, but have suffered from several drawbacks. First, due to the pattern of high-agitation regions created by the probe 38, uneven cleaning of the substrate 20 may take place, with more cleaning action occurring near the high-agitation regions 48 and reduced cleaning performance in the "gaps" between the high-agitation regions. It has also been observed that the higher-intensity megasonic energy found in the high-agitation regions 48 can damage electronic devices on the substrate, particularly when used to clean substrates forming densely-packed and/or high-aspect devices, as has become increasingly commonplace in recent years. Finally, it has often been found necessary to increase the power supplied to the transducer, and/or expose the substrate to the megasonic energy radiated by the probe for prolonged periods of time, in order to facilitate satisfactory cleaning of the substrate between the high-agitation regions.

Additional details pertaining to megasonic cleaning systems and not necessary to recite here may be found in Assignee's above referenced U.S. Pat. No. 6,140,744, issued Oct. 31, 2000 and entitled SUBSTRATE CLEANING SYSTEM, the entirety of which patent is hereby incorporated by reference herein and made a part of this disclosure.

Figure 3:
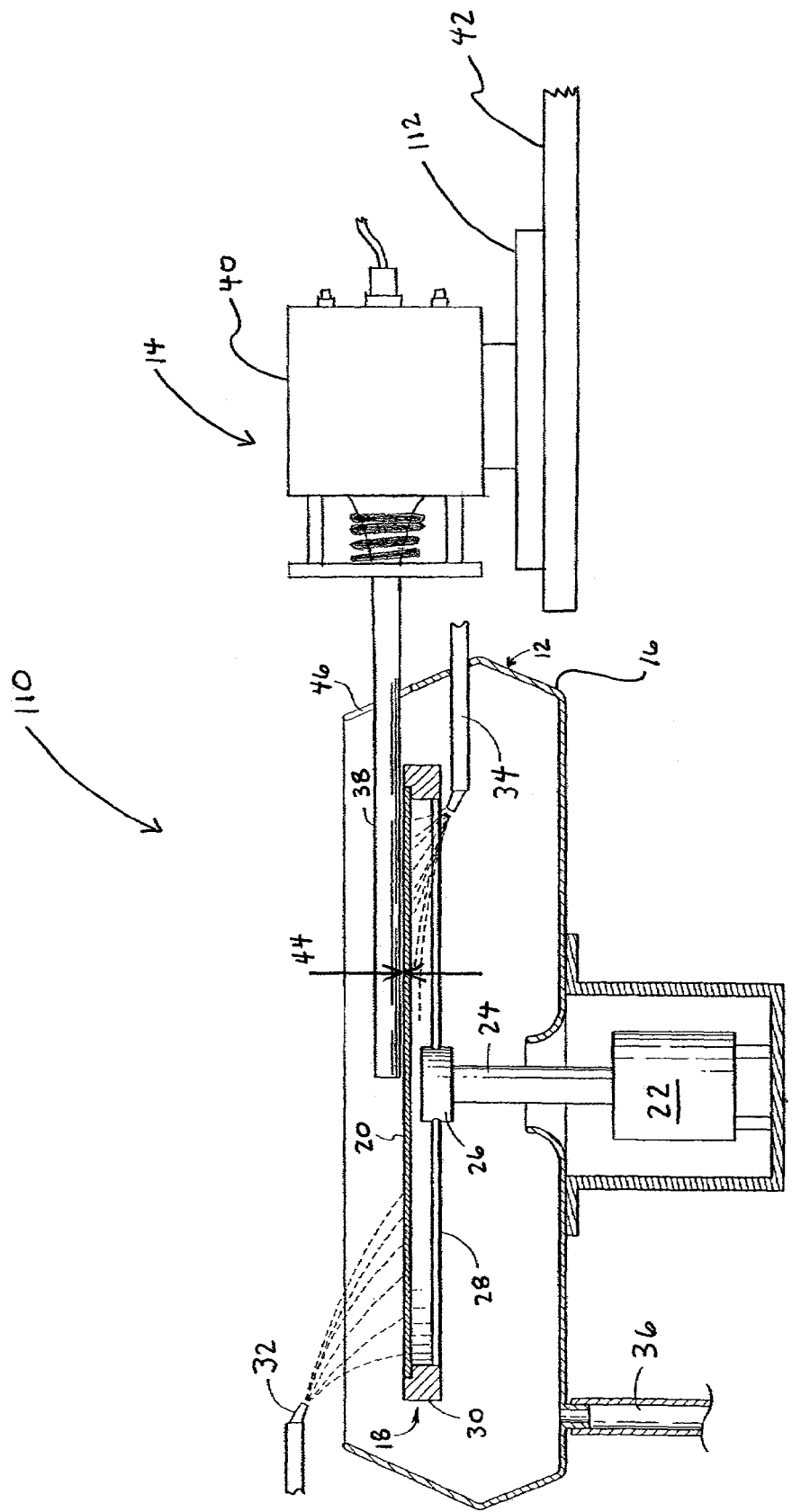
FIG. 3 is a schematic side elevation view of the inventive megasonic wafer cleaner.
Figure 4:
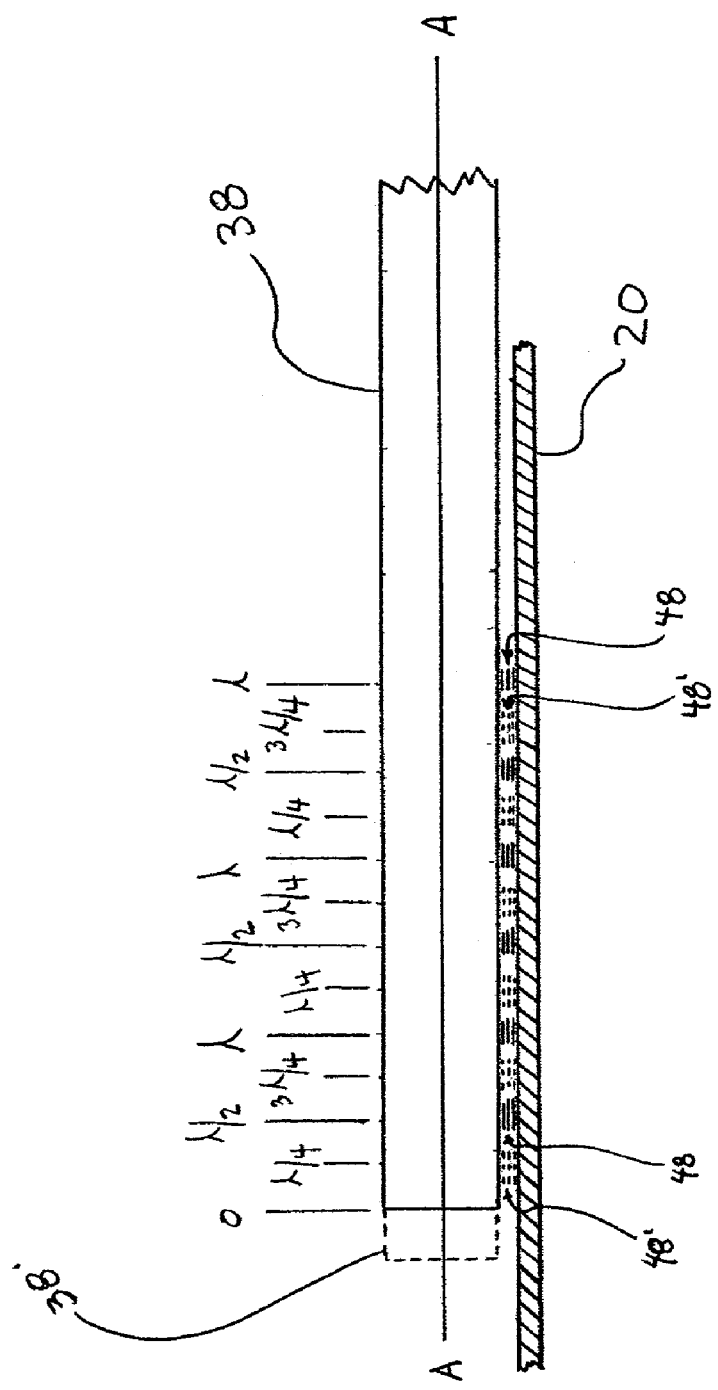
FIG. 4 is a schematic side elevation view of a transmitter-wafer junction of the inventive cleaner of FIG. 3.

FIGS. 3 and 4 illustrate a preferred embodiment of the inventive substrate cleaning apparatus 110. The apparatus 110 may be generally similar to the apparatus 10 disclosed above and depicted in FIGS. 1–2, incorporating the transmitter assembly 14, tank 16, fixture 18, etc. However, the present invention is by no means limited to application in the specific cleaning apparatus 10 disclosed above; one of skill in the art will appreciate that the present invention encompasses use in connection with other megasonic cleaners which generate a standing megasonic wave oriented generally parallel to a surface of a substrate being cleaned. Other suitable examples of prior-art megasonic cleaners are disclosed in U.S. Pat. No. 6,140,744, incorporated by reference above. In one preferred embodiment, the probe 38 has a shaft of 1 cm diameter and is driven at a frequency of about 835 kHz.

The apparatus 110 incorporates a reciprocation drive 112 which is operatively connected to the transmitter assembly 14 (by, for example, installation between the housing 40 and the support 42 as shown) so as to impart a reciprocating motion to the probe 38 and to the standing wave developed therein. In reciprocating the probe 38 and standing wave, the reciprocation drive 112 moves the pattern of high-agitation regions 48 back-and-forth with respect to the substrate surface (see FIG. 4), providing more uniform cleaning of the substrate. As the probe 38 moves into and through the location occupied by the displaced probe 38', the high-agitation regions 48 correspondingly move into and through the location occupied by the displaced high-agitation regions 48', which location now benefits from the cleaning action associated with the regions 48'.

The reciprocation drive 112 may comprise any suitable mechanism needed to achieve the reciprocation performance discussed herein, and the specific components of the drive 112 will be readily ascertainable by one of ordinary skill in the art of substrate processing machine design.

In one embodiment, the reciprocation drive 112 comprises a linear reciprocation drive and imparts a substantially linear reciprocation motion to the probe/standing wave. It is presently preferred that the reciprocation drive 112 moves the probe back-and-forth substantially linearly, generally along the longitudinal axis A—A of the probe 38. However, the probe 38 may alternatively be reciprocated along any suitable line generally parallel to the surface of the substrate 20 (such as a laterally oriented line, i.e. one oriented either generally perpendicular to the axis A—A, or a line oriented transverse to the axis A—A). Preferably, the reciprocation drive 112 imparts a substantially linear reciprocation action to the probe 38 (and the standing wave formed therein) in which the probe/wave is alternately displaced in a first direction by a distance preferably equal to about 0.5 to 2.0 times the wavelength of the megasonic energy in the probe, and displaced in the opposite direction by a substantially equal distance. Therefore, where the wavelength of the applied megasonic energy is about 0.3" (as is commonly employed in the semiconductor industry) the preferred reciprocation distance is about 0.150" to about 0.6", although smaller or larger distances may be suitable as well. In one embodiment, the reciprocation rate is about 0.1 to 2.0 cycles per second; of course, any suitable reciprocation rate may be employed.

In another embodiment, the reciprocation drive 112 comprises an angular reciprocation drive and imparts an angular reciprocation motion to the probe/standing wave. The degree of angular back-and-forth displacement should be sufficient to provide the desired uniform cleaning of the substrate 20. As with the linear reciprocation disclosed above, in one embodiment, the reciprocation rate is about 0.1 to 2.0 cycles per second; of course, any suitable reciprocation rate may be employed.

As a further alternative, the reciprocation drive 112 could be operatively connected to the fixture 18 (and thereby to the substrate 20), instead of or in addition to the connection of the drive 112 to the transmitter assembly 14. Such reciprocation of the fixture 18/substrate 20 may be performed according to the parameters detailed above with respect to reciprocation of the probe. Furthermore, it is contemplated that any suitable method or structure can be employed, so long as relative back-and-forth movement is created between the substrate and the probe/standing wave/high-agitation regions.

Figure 5:
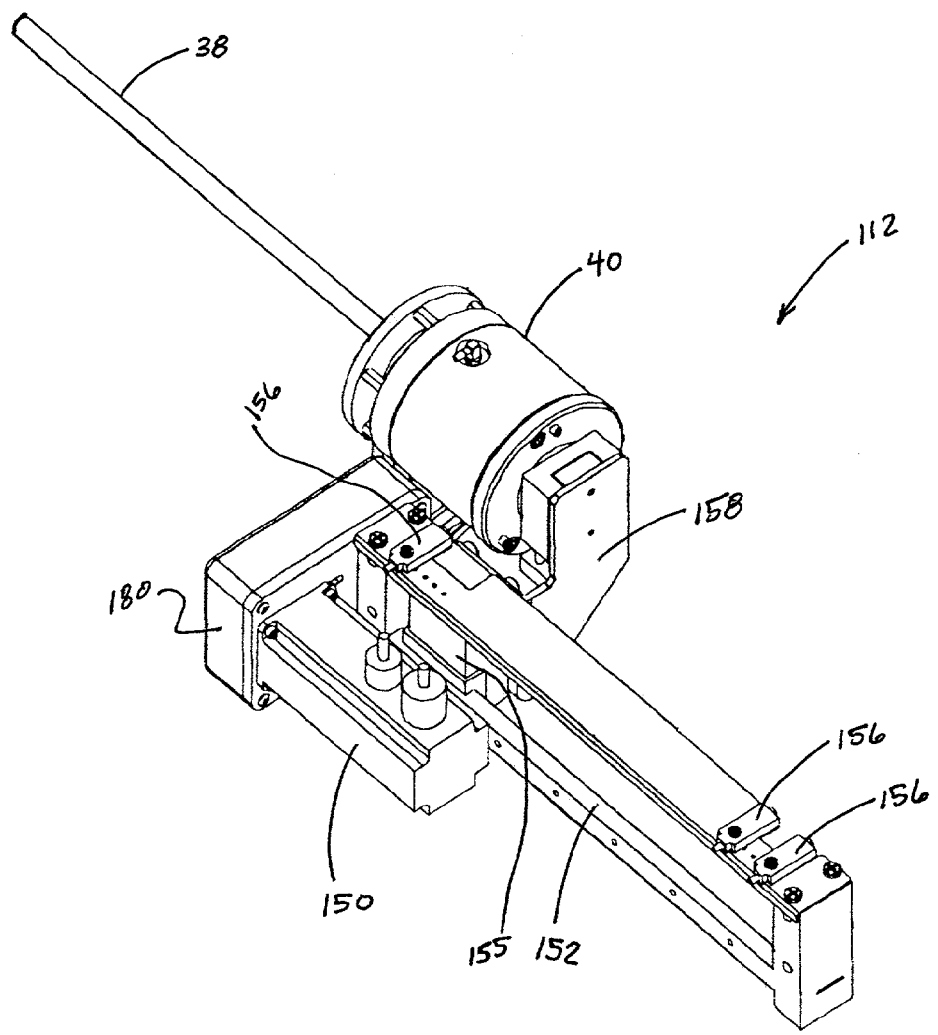
FIG. 5 is a perspective view of one embodiment of a reciprocation drive for use with the cleaner of FIG. 3.
Figure 6:
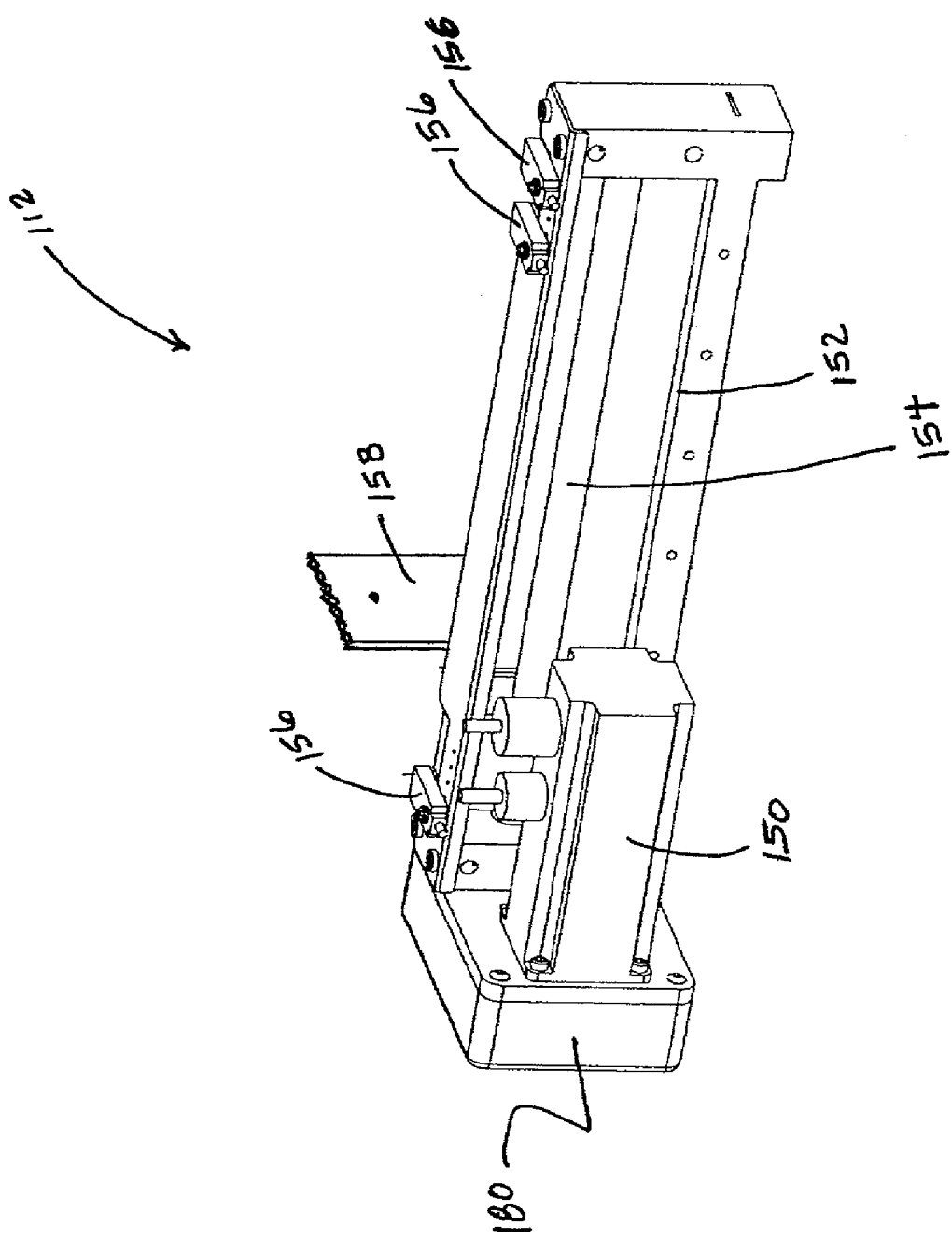
FIG. 6 is a partial perspective view of the reciprocation drive of FIG. 5.

FIGS. 5 and 6 depict one embodiment of a reciprocation drive 112 which may be incorporated in the apparatus 110. The reciprocation drive 112 includes a motor 150 (which may comprise a servo-motor), a linear bearing 152, a drivescrew 154 (which may comprise a leadscrew or a ballscrew), and a carrier 155 which engages the drivescrew 154 and the bearing 152. Thus, as the motor 150 turns the drivescrew 154 via a belt drive, gear train, etc. (not shown) located in a housing 180, the carrier 155 advances forward or backward on the drivescrew 154 and the bearing 152. Proximity sensors 156 may be employed for sensing the limit and home positions of the carrier 155. The housing 40 and probe 38 are mounted to the carrier 155 via a bracket 158.

The reciprocation drive 112 shown in FIGS. 5 and 6 may be driven by a controller (not shown) which positions the probe 38 with respect to the substrate 20 (see FIG. 3). Various control strategies may be implemented to maximize performance of the apparatus 110. These strategies may be selected depending upon many factors, for example, the size of the substrate, the cleaning solution used, the sensitivity of the structures located on the surface of the substrate, and the degree of cleanliness required, among others. These control strategies can be illustrated graphically, for example on a two-dimensional graph.

Figure 7A:
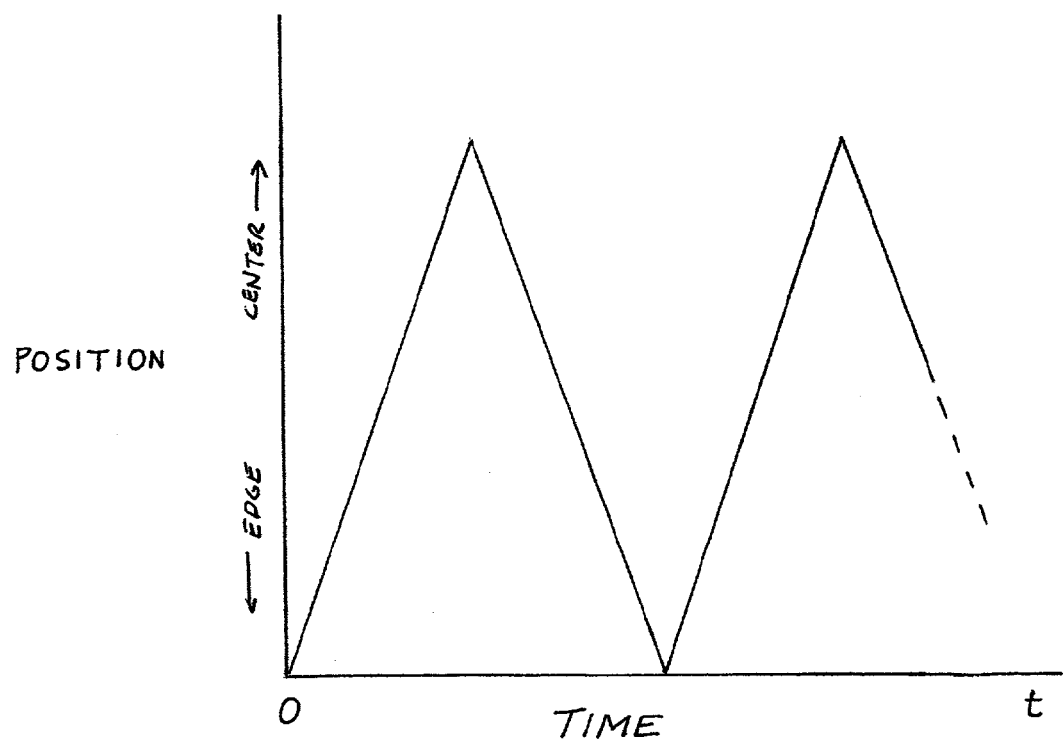
FIG. 7A is a graph of one control methodology for the reciprocation drive.

FIG. 7A depicts the position of the probe 38 over time, in accordance with one suitable control strategy. More specifically, FIG. 7A plots the position of the probe 38 on the y-axis and time on the x-axis. Movement toward the center of the substrate corresponds to upward movement on the y-axis, and movement toward the edge of the substrate corresponds to downward movement on the y-axis. The solid line in FIG. 7 thus represents the position of the probe 38 over time with respect to the substrate 20. In accordance with the depicted control strategy, the motor 150 extends the probe 38 toward the center of the substrate (preferably in a generally radial orientation with respect to the substrate) at a substantially constant linear velocity with respect to the bearing 152 until the probe tip reaches a limit near, at or just beyond the center of the substrate. The probe is then stopped and reversed at a substantially constant linear velocity toward an opposite limit near, at or beyond the edge of the substrate. The probe may be advanced back and forth in this manner as many times as desired throughout a cleaning cycle, to form a "sawtooth" pattern as depicted in FIG. 7A.

Figure 7B:
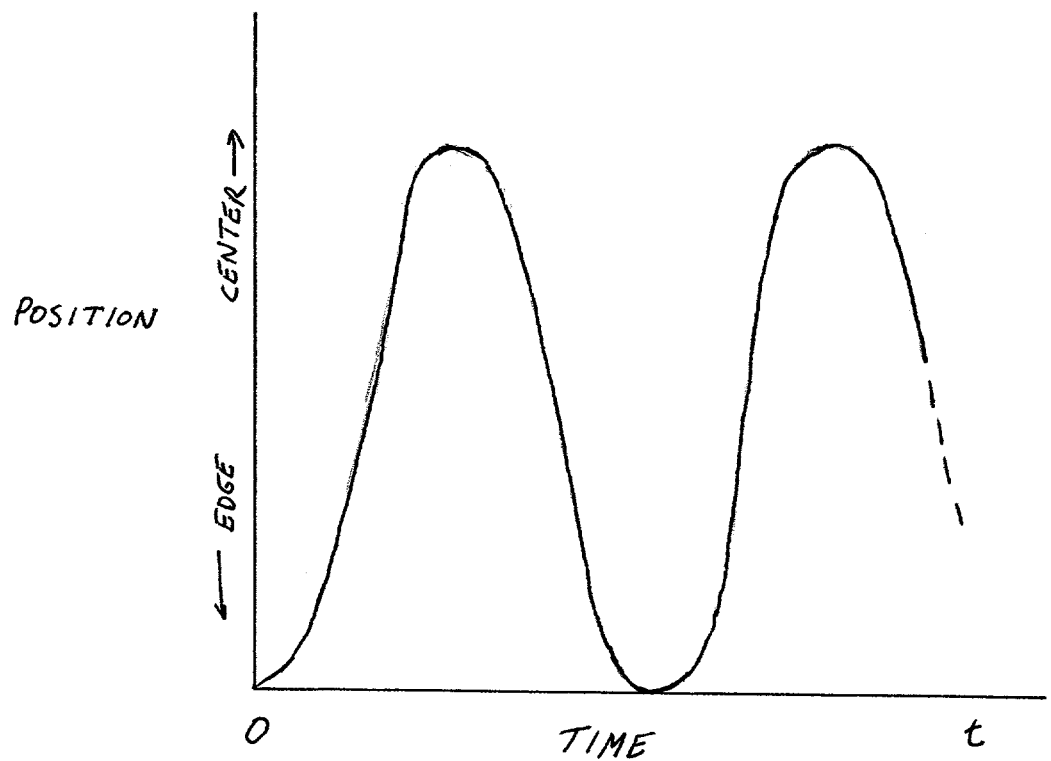
FIG. 7B is a graph of another control methodology for the reciprocation drive.
Figure 8:
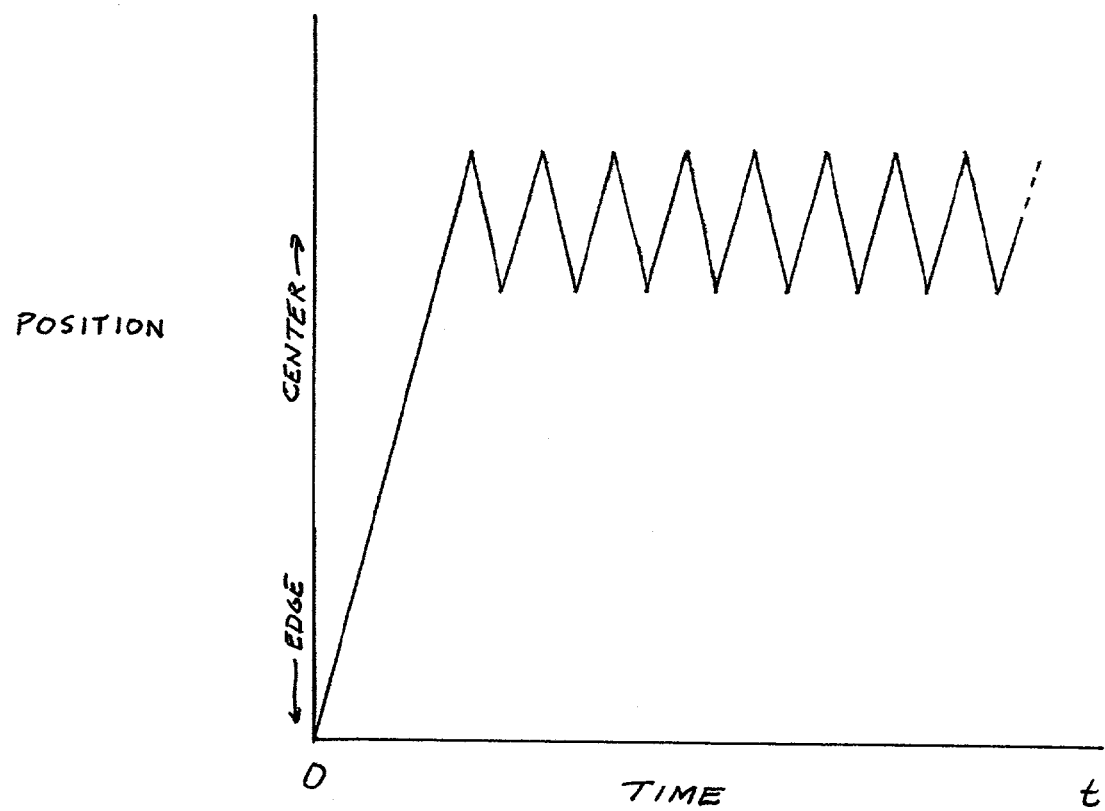
FIG. 8 is a graph of another control methodology for the reciprocation drive.

FIG. 7B depicts another suitable control strategy for movement of the probe 38. This strategy comprises a sinusoidal pattern, in which the motion of the probe is gradually slowed and then reversed at opposing limits near, at or beyond the center and edge of the substrate. In another control strategy, shown in FIG. 8, the probe makes a long initial excursion toward the center of the substrate and is then reciprocated in a relatively tight sawtooth pattern in which the limits of travel are narrowly spaced in comparison to the distance over which the probe travels during the initial excursion. The distance between the limits of travel of the sawtooth portion shown in FIG. 8 may, in one embodiment, be equivalent to between about one-half and about twice the wavelength of the megasonic energy being driven through the probe. In further variations, a "tight" sinusoidal pattern or any other suitable tight control strategy may follow the initial excursion shown in FIG. 8.

In yet another suitable control strategy, the probe 38 is moved at a slower rate at one or both of the endpoints of its range of travel (near the edge and center of the substrate) than in some or all of the probe's travel range between these endpoints.

It should be further noted that in any of the control strategies depicted and/or discussed herein, the megasonic power supplied to the probe 38 may be switched on or off at appropriate points in the movement profile of the probe, so as to provide even cleaning of the substrate with minimal damage to the structures formed thereon. For example, in the strategy shown in FIG. 12, the power may be switched off during the initial excursion and then switched on during the subsequent "sawtooth" movement of the probe.

In another embodiment, the frequency of the megasonic energy imparted to the probe 38 can be modulated over time, instead of or in addition to moving the probe with respect to the substrate. As the frequency is varied over time, the high-agitation regions 48 (see FIG. 4) converge (as the frequency increases) or diverge (as the frequency decreases). Thus, by modulating the frequency the regions 48 can be moved with respect to the substrate 20, to generate a more even cleaning action as discussed above. In one embodiment, the frequency is varied steadily over time about a center frequency of approximately 835 kHz. In another embodiment, the degree of variation may be about ±2 kHz with respect to a chosen center frequency. In another embodiment, the frequency is modulated with a period of about 1 to 2000 milliseconds between successive frequency peaks or troughs. Naturally, any suitable center frequency, degree of variation, or period may be employed in other embodiments.

Figure 9:
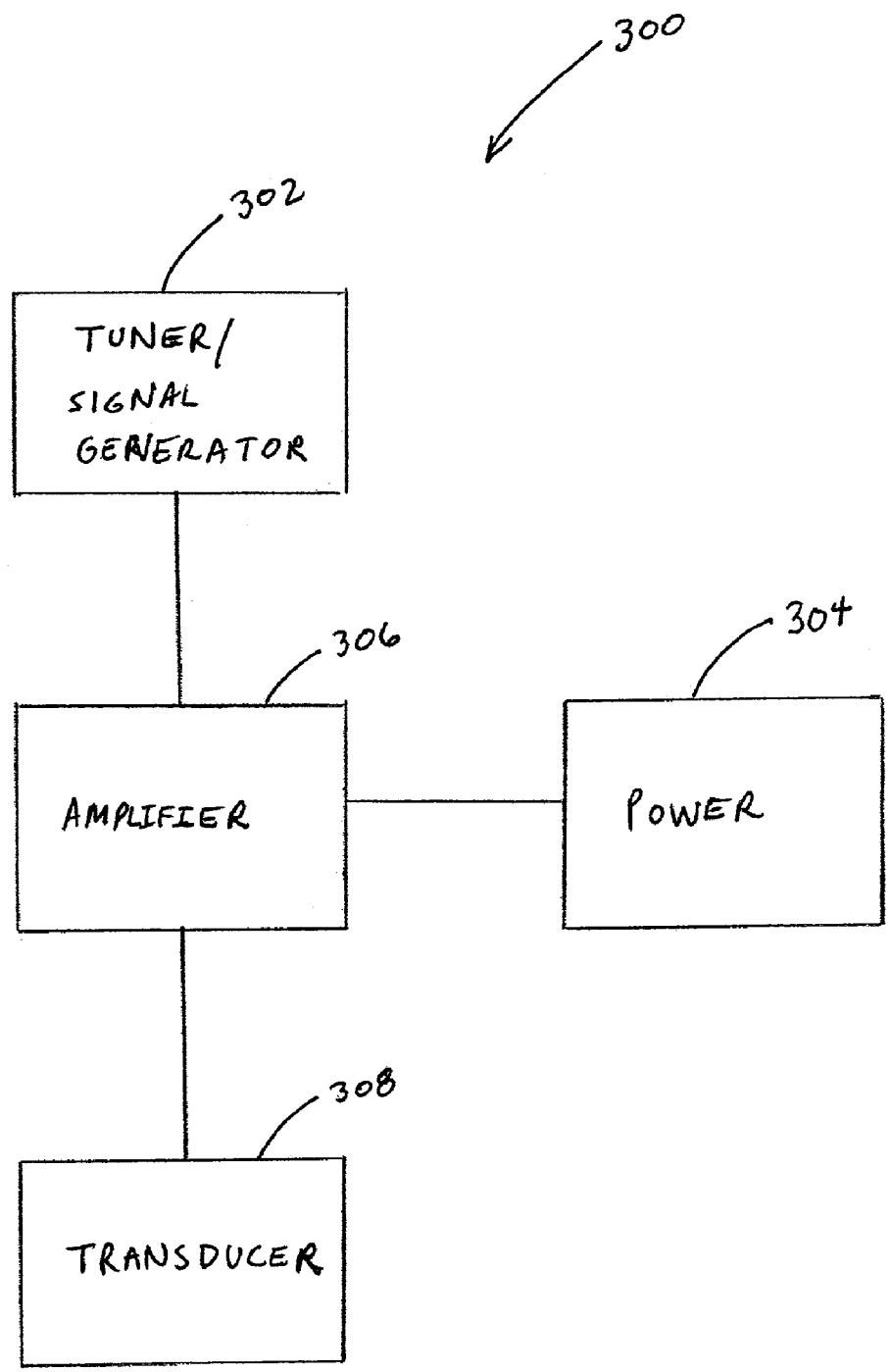
FIG. 9 is a schematic view of a modulation system for the cleaner.

FIG. 9 depicts one embodiment of a modulation system 300 which may be employed to modulate the frequency of the megasonic energy imparted to the probe 38. The modulation system 300 includes a tuner or signal generator 302 and a power supply 304, both of which are electrically connected to an amplifier 306. The amplifier 306 drives a megasonic transducer 308, which is located in the probe housing 40 as discussed above and may be generally similar to the transducer described above and in the incorporated U.S. Pat. No. 6,140,744. The tuner 302 may comprise any suitable commercially available tuner having modulation capability. Alternatively, the tuner 302 may comprise program instructions executable by a computer, control system, processor, etc. in communication with the amplifier 306 and/or power supply 304. It should be further noted that the tuner 302, power supply 304 and amplifier 306 may comprise physically separate components; alternatively, two or more of these items may be combined as a single device. By modulating the frequency of the signal generated by the tuner 302 and passed to the amplifier 306, one can modulate the frequency of the power delivered by the amplifier 306 to the transducer 308.

The megasonic cleaning apparatus and method disclosed herein provides numerous performance advantages over known cleaners. As mentioned above, the apparatus 110 facilitates more uniform cleaning of the entire substrate surface, eliminating the reduced cleaning observed "between" the high-agitation regions in a stationary cleaner. In addition, the apparatus 110 reduces the tendency of a cleaner to damage the electronic devices on the surface of the substrate at the high-agitation regions, by avoiding prolonged exposure of any portion of the substrate surface to the higher energy associated with the high-agitation regions. Finally, the apparatus 110 requires less time and/or less power to clean a substrate of a given size, as substantially the entire surface of the substrate gains exposure to the high-energy, high-agitation regions during the cleaning process.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In particular, the transmitter element that extends close to the surface of the substrate may have various shapes in addition to the elongated rod element illustrated in the drawings. For example, the element can have a flat lower surface with any desired cross-section including a hollow element. Further, although the element illustrated is supported in cantilever fashion, the transmitter could be supported from above the substrate being cleaned. Thus, it is intended that the scope of the present invention herein disclosed should not be limited by the particular disclosed embodiments described above, but should be determined only by a fair reading of the claims that follow.

What is claimed is:

1. A method of cleaning a substrate, the method comprising:
   placing said substrate on a rotating fixture;
   applying a liquid to at least one side of said substrate;
   positioning a transmitter generally parallel to and close to but spaced from said substrate with a megasonic transducer in acoustically coupled relation to said transmitter, said transmitter being in contact with said liquid applied to said at least one side of said substrate;
   creating a standing wave of megasonic energy oriented generally parallel to said substrate with said transmitter, said standing wave generating an associated pattern of high-agitation regions in said liquid; and
   creating relative back-and-forth movement between said standing wave and said substrate so as to move said pattern of high-agitation regions in a radial direction with respect to said substrate.

2. The method of claim 1, wherein the step of creating a standing wave comprises creating said wave along a line generally parallel to a surface of said substrate.

3. The method of claim 1, wherein the step of creating said relative back-and-forth movement comprises reciprocating said transmitter substantially linearly along its longitudinal axis.

4. The method of claim 1, wherein the step of creating said relative back-and-forth movement comprises reciprocating said transmitter substantially linearly along a line generally perpendicular to its longitudinal axis.

5. The method of claim 1 wherein the step of creating said relative back-and-forth movement comprises reciprocating said transmitter substantially linearly along a line generally transverse to its longitudinal axis.

6. The method of claim 1, wherein said substrate comprises a semiconductor wafer.

7. A method of cleaning a substrate, the method comprising:
   placing said substrate on a rotating fixture;
   applying a liquid to at least one side of said substrate;
   creating a standing wave of megasonic energy oriented generally parallel to said substrate, said standing wave generating an associated pattern of high-agitation regions in said liquid; and
   creating relative back-and-forth movement between said standing wave and said substrate by reciprocating said standing wave in a substantially linear fashion so as to move said pattern of high-agitation regions in a radial direction with respect to said substrate.

8. The method of claim 7 wherein the step of creating said relative back-and-forth movement further comprises reciprocating said standing wave in a substantially linear fashion at a frequency of about 0.1 to 2 cycles per second.

9. A method of cleaning a substrate, the method comprising:
   placing said substrate on a rotating fixture;
   applying a liquid to at least one side of said substrate;
   creating a standing wave of megasonic energy oriented generally parallel to said substrate, said standing wave generating an associated pattern of high-agitation regions in said liquid; and
   creating relative back-and-forth movement between said standing wave and said substrate so as to move said pattern of high-agitation regions in a radial direction with respect to said substrate;
   wherein the step of creating relative back-and-forth movement comprises displacing said standing wave in a substantially linear fashion, by a distance of about 0.5 to 2 times the wavelength of said standing wave, in a first direction; and displacing said standing wave in a substantially linear fashion, by substantially the same distance, in the opposite direction.

10. A method of cleaning a substrate, the method comprising:
    placing said substrate on a rotating fixture;
    applying a liquid to at least one side of said substrate;
    creating a standing wave of megasonic energy oriented generally parallel to said substrate, said standing wave generating an associated pattern of high-agitation regions in said liquid; and
    creating relative back-and-forth movement between said standing wave and said substrate by reciprocating said standing wave substantially angularly so as to move said pattern of high-agitation regions with respect to said substrate.

11. The method of claim 10, wherein the step of reciprocating said standing wave substantially angularly comprises reciprocating said standing wave substantially angularly at a frequency of about 0.1 to 2 cycles per second.

12. A method of cleaning a substrate, the method comprising:
    placing said substrate on a rotating fixture;
    placing a liquid on at least one side of said substrate;
    positioning a transmitter generally parallel to and close to but spaced from said substrate with a megasonic transducer in acoustically coupled relation to said transmitter, said transmitter being in contact with said liquid applied to said at least one side of said substrate;

creating a standing wave of megasonic energy oriented generally parallel to said substrate with the transmitter, said standing wave generating an associated pattern of high-agitation regions in said liquid; and a causing back-and-forth movement of said standing wave relative to said substrate or vice versa so as to move said pattern of high-agitation regions in a radial direction with respect to said substrate.

13. The method of claim 12, wherein the step of creating a standing wave comprises creating said wave along a line generally parallel to a surface of said substrate.

14. A method of cleaning a substrate, the method comprising:

placing said substrate on a rotating fixture;

placing a liquid on at least one side of said substrate;

creating a standing wave of megasonic energy oriented generally parallel to said substrate, said standing wave generating an associated pattern of high-agitation regions in said liquid;

a causing back-and-forth movement of said standing wave relative to said substrate or vice versa so as to move said pattern of high-agitation regions in a radial direction about with respect to said substrate; and wherein the step of causing back-and-forth movement of said standing wave relative to said substrate comprises: displacing said standing wave in a substantially linear fashion, by a distance of about 0.5 to 2 times the wavelength of said standing wave, in a first direction; and displacing said standing wave in a substantially liner fashion, by substantially the same distance, in the opposite direction.

15. The method of claim 12, wherein the step of causing back-and-forth movement of said standing wave relative to said substrate comprises: displacing said substrate in a substantially linear fashion, by a distance of about 0.5 to 2 times the wavelength of said standing wave, in a first direction; and displacing said substrate in a substantially linear fashion, by substantially the same distance, in the opposite direction.

16. The method of claim 14, wherein the step of causing back-and-forth movement of said standing wave relative to said substrate further comprises reciprocating said standing wave in a substantially linear fashion at a frequency of about if 0.1 to 2 cycles per second.

17. The method of claim 15, wherein the step of causing back-and-forth movement of said standing wave relative to said substrate further comprises reciprocating said substrate in a substantially linear fashion at a frequency of about 0.1 to 2 cycles per second.

18. The method of claim 12, wherein said substrate comprises a semiconductor wafer.

* * * * *

UNITED STATES PATENT AND TRADEMARK OFFICE
CERTIFICATE OF CORRECTION

| | | |
|---|---|---|
| PATENT NO. | : 7,185,661 B2 | Page 1 of 1 |
| APPLICATION NO. | : 10/140029 | |
| DATED | : March 6, 2007 | |
| INVENTOR(S) | : Mario E. Bran | |

It is certified that error appears in the above-identified patent and that said Letters Patent is hereby corrected as shown below:

Column 9 line 6, after "said substrate", please delete "or vice versa"

line 21, after "said substrate", please delete "or vice versa"

Signed and Sealed this

Twenty-second Day of May, 2007

JON W. DUDAS
*Director of the United States Patent and Trademark Office*